(12) United States Patent
Yokoo et al.

(10) Patent No.: US 8,591,706 B2
(45) Date of Patent: Nov. 26, 2013

(54) SPUTTERING SYSTEM AND METHOD FOR DEPOSITING THIN FILM

(75) Inventors: Masayoshi Yokoo, Yamagata (JP); Isao Tanikawa, Yamagata (JP); Norikazu Kainuma, Yamagata (JP); Yoshinobu Takano, Yamagata (JP)

(73) Assignee: Tohoku Seiki Industries, Ltd., Yamagata (JP)

(*) Notice: Subject to any disclaimer, the term of this patent is extended or adjusted under 35 U.S.C. 154(b) by 909 days.

(21) Appl. No.: 12/294,294

(22) PCT Filed: Mar. 28, 2006

(86) PCT No.: PCT/JP2006/306346
§ 371 (c)(1),
(2), (4) Date: Sep. 4, 2009

(87) PCT Pub. No.: WO2007/110937
PCT Pub. Date: Oct. 4, 2007

(65) Prior Publication Data
US 2010/0006422 A1    Jan. 14, 2010

(51) Int. Cl.
*C23C 14/34*    (2006.01)
(52) U.S. Cl.
USPC .................... 204/192.12; 204/298.12
(58) Field of Classification Search
USPC .................................................. 204/298.11
See application file for complete search history.

(56) References Cited

U.S. PATENT DOCUMENTS

| | | | | |
|---|---|---|---|---|
| 6,740,209 | B2* | 5/2004 | Shibamoto et al. | 204/192.12 |
| 6,841,049 | B2* | 1/2005 | Ito et al. | 204/298.15 |
| 2001/0030124 | A1* | 10/2001 | Flanigan | 204/192.15 |

FOREIGN PATENT DOCUMENTS

| | | | |
|---|---|---|---|
| JP | 60135567 A | * | 7/1985 |
| JP | 2000-345331 | | 12/2000 |
| JP | 2002-025132 | | 1/2002 |
| JP | 2002-047555 | | 2/2002 |
| JP | 2003-303451 | | 10/2003 |
| JP | 2005-248249 | | 9/2005 |
| JP | 2005248249 A | * | 9/2005 |

* cited by examiner

*Primary Examiner* — Emily Le
*Assistant Examiner* — Jenny Wu
(74) *Attorney, Agent, or Firm* — Mattingly & Malur, PC

(57) ABSTRACT

A sputtering system for depositing a thin film on the surface of a disc substrate in which high precision positioning of an inner mask and an outer mask is facilitated. The sputtering system has a mask member placed on the surface of the substrate mounted on a substrate holder to cover a partial region on the surface of the substrate. A thin film is deposited by sputtering in a region on the surface of the substrate not covered by the mask member. A section for carrying in and carrying out the substrate has mechanically holds and releases the substrate holder mounting the substrate, and mechanically holds and releases the mask member.

1 Claim, 11 Drawing Sheets

SPUTTERING SYSTEM AND METHOD FOR DEPOSITING THIN FILM

TECHNICAL FIELD

The present invention relates to a sputtering system and a method for depositing a thin film and, more particularly, to a technique which can be effectively applied to a sputtering system and a method for depositing a thin film for use in the manufacture of a writable or rewritable CD (Compact Disc), a DVD (Digital Versatile Disc), or the like.

BACKGROUND ART

Conventional recording media for recording music data, image data, or data for use in a computer or the like include a disc-shaped recording medium (hereinafter will be referred to as "disc"), such as a CD or a DVD. Such discs include not only read-only discs but also, for example, once-writable discs and repeatedly rewritable discs.

Such a disc has a single or plural thin film layers deposited on a surface of a disc-shaped disc substrate having an opening portion defined centrally thereof. Such a thin film layer is deposited by sputtering for example.

In depositing a thin film layer on the surface of the disc substrate, initially, the disc substrate fed from the outside of a sputtering system is carried into the sputtering system. At that time, the disc substrate is carried into the sputtering system by a disc substrate carrying-in and carrying-out section (which is also called "disc substrate transfer unit") provided in the sputtering system. The disc substrate carrying-in and carrying-out section also carries out the disc substrate having the thin film deposited thereon by the sputtering system to the outside of the sputtering system.

At that time, the conventional disc substrate carrying-in and carrying-out section picks up the disc substrate fed from, for example, a disc exchange unit located outside the sputtering system by holding the opening portion defined centrally of the disc substrate with a bore chuck and then moves the disc substrate to a carry-in entrance provided at a thin film depositing section of the sputtering system. Thereafter, with a disc receiving tray inside the sputtering system being previously placed adjacent the carry-in entrance, the bore chuck is released to pass the disc substrate to the disc receiving tray, thereby completing the carrying-in of the disc substrate.

When carrying out the disc substrate having the thin film deposited thereon, the disc receiving tray mounting the disc substrate having the thin film deposited thereon is previously placed adjacent the carry-in entrance and then the disc substrate is picked up by holding the opening portion defined centrally of the disc substrate with the bore chuck of the disc substrate carrying-in and carrying-out section. Thereafter, the disc substrate thus picked up is moved to the disc exchange unit and then the bore chuck is released to pass the disc substrate to the disc exchange unit, thereby completing the carrying-out of the disc substrate.

However, since the thin film is deposited by the sputtering system usually under a high temperature condition, the disc substrate is thermally deformed. For this reason, when, for example, the disc substrate is solely carried out of the sputtering system, time is required to cool the disc substrate in order to prevent the bore chuck from mischucking due to thermal deformation of the opening portion of the disc substrate. As a result, a problem arises that the availability factor lowers.

As a method for solving such a problem, there is, for example, a method including feeding the disc substrate as mounted on a substrate holder which is less susceptible to thermal deformation than the disc substrate and carrying the substrate holder mounting the disc substrate into the sputtering system.

In depositing the thin film on the surface of the disc substrate, it is a general practice to cover the periphery of the opening portion defined centrally of the disc substrate and an outer peripheral portion of the disc substrate with an inner mask and an outer mask, respectively, and then deposit the thin film annularly in a region covered with neither the inner mask nor the outer mask. At that time, it is also a general practice for the conventional sputtering system to place the inner mask and the outer mask on the surface of the substrate within the sputtering system. As a method for placing the inner mask and the outer mask on the surface of the substrate, there is, for example, a method including providing a mask column functioning as the inner mask on a central portion of a target and the outer mask on an outer peripheral portion of the target and then bringing the surface of the disc substrate into contact with the mask column and the outer mask (see Patent Document 1 for example).

Other methods include, for example, a method including: providing a mask transfer section inside the sputtering system; placing the inner mask and the outer mask on the surface of the disc substrate halfway through movement of the disc substrate and substrate holder carried into the sputtering system to a sputtering position; and removing the inner mask and outer mask placed on the surface of the disc substrate halfway through movement of the disc substrate having the thin film deposited thereon and the substrate holder to a carrying-out position (see Patent Document 2 for example).

Patent Document 1: Japanese Patent Laid-Open No. 2002-25132
Patent Document 2: Japanese Patent Laid-Open No. 2002-47555

With the sputtering system for use in the manufacture of a conventional CD or DVD, however, it is a general practice to place the inner mask and the outer mask on the surface of the substrate within the sputtering system.

Discs including such a DVD have been improved in recording density in recent years and hence call for an ultrafine structure, a high density, and high precision. For this reason, a film deposition region for the thin film to be deposited on the disc substrate also calls for high precision. That is, the sputtering system for depositing the thin film on the disc substrate calls for high precision positioning of the inner and outer masks relative to the disc substrate. It takes time for such positioning (i.e., centering setup) to be achieved. Particularly, a repeatedly rewritable DVD, such as DVD-RAM (DVD-Random Access Memory) or DVD-RW (ReWritable), has multilayer thin films and, hence, it takes time for the positioning of the inner and outer masks to be achieved before deposition of each thin film. Thus, a problem exists that the availability factor and the disc productivity lower.

In depositing the thin film on the surface of the disc substrate by the sputtering system, the thin film is deposited also on the surfaces of the inner and outer masks. For this reason, maintenance is necessary for periodically cleaning the inner and outer masks. However, since the conventional sputtering system of the common type has the inner and outer masks placed inside a vacuum chamber (i.e., thin film depositing section), a problem exists that the operation for removing the inner and outer masks before cleaning and the operation for mounting the inner and outer masks after cleaning are troublesome and, hence, it takes time to complete these operations.

In recent years, a method of fixing the inner mask and the outer mask to the substrate holder by utilizing a magnet, has been proposed which is applicable to the sputtering system for depositing the thin film on the surface of the disc substrate (see Japanese Patent Laid-Open No. 2003-303451 for example). This method includes fixing the inner mask and the outer mask to the disc substrate mounted on the substrate holder, for example, at a place outside the sputtering system and then carrying the disc substrate kept in this state into the sputtering system. The method, however, involves a problem that a mechanism is necessary for fixing the inner and outer masks to the disc substrate during the carrying-in operation and removing the inner and outer masks during the carrying-out operation.

An object of the present invention is to provide a technique which is capable of facilitating high precision positioning of the inner mask and outer mask in a sputtering system for depositing a thin film on a surface of a disc-shaped disc substrate.

Another object of the present invention is to provide a technique which is capable of facilitating maintenance of the inner mask and outer mask in the sputtering system for depositing a thin film on a surface of a disc-shaped disc substrate.

Another object of the present invention is to provide a technique which is capable of facilitating high precision positioning of the inner mask and outer mask, facilitating maintenance, and simplifying the system configuration in the sputtering system for depositing a thin film on a surface of a disc-shaped disc substrate.

The foregoing and other objects and novel features of the present invention will become apparent from the description of the present invention and the attached drawings.

DISCLOSURE OF THE INVENTION

Representatives of inventions disclosed in the instant application are summarized as follows.

(1) A sputtering system for depositing a thin film, comprising: a thin film depositing section for depositing the thin film on a surface of a substrate; and a substrate carrying-in and carrying-out section for carrying the substrate fed from outside of the thin film depositing section into the thin film depositing section and carrying out the substrate on which the thin film is deposited by the thin film depositing section to the outside of the thin film depositing section, wherein: a mask member is placed on the surface of the substrate mounted on a substrate holder to cover a partial region on the surface of the substrate, and the thin film is deposited by sputtering in a region on the surface of the substrate not covered with the mask member; and the substrate carrying-in and carrying-out section has substrate holder holding and releasing means performing mechanical holding and releasing of the substrate holder mounting the substrate, and mask member holding and releasing means performing mechanical holding and releasing of the mask member.

(2) The sputtering system according to item (1), wherein: the substrate is disc-shaped with an opening portion defined centrally thereof; the substrate holder has a cylindrical positioning section for positioning the substrate by being inserted through the opening portion of the substrate; the mask member comprises an annular inner mask covering a periphery of the opening portion of the substrate and having an opening portion through which the positioning section of the substrate holder is inserted, and an annular outer mask covering an outer peripheral portion of the substrate and engaging an outer periphery of the substrate holder; the substrate carrying-in and carrying-out section has the substrate holder holding and releasing means, inner mask holding and releasing means performing mechanical holding and releasing of the inner mask, outer mask holding and releasing means performing mechanical holding and releasing of the outer mask, and holding and releasing control means performing a control of switching between holding and releasing of the substrate holder by the substrate holder holding and releasing means and a control of holding or releasing of the inner mask by the inner mask holding and releasing means; and the thin film depositing section has holding and releasing control means performing a control of holding or releasing of the outer mask by the outer mask holding and releasing means.

(3) The sputtering system according to item (2), wherein: the substrate holder holding and releasing means is a chuck for holding or releasing the substrate holder by an inner peripheral surface of the positioning section of the substrate holder; the inner mask holding and releasing control means is a chuck for holding or releasing the inner mask by an outer peripheral surface of the inner mask; and the outer mask holding and releasing control means is a chuck for holding or releasing the outer mask by an outer peripheral surface of the outer mask.

(4) The sputtering system according to item (3), wherein: the positioning section of the substrate holder has a groove in an inner peripheral surface thereof; each of the inner mask and the outer mask has a groove in an outer peripheral surface thereof; the chuck for holding or releasing the substrate holder has a claw for engagement with the groove in the inner peripheral surface of the positioning section of the substrate holder; the chuck for holding or releasing the inner mask has a claw for engagement with the groove in the outer peripheral surface of the inner mask; and the chuck for holding or releasing the outer mask has a claw for engagement with the groove in the outer peripheral surface of the outer mask.

(5) A method for depositing a thin film, comprising: a first step of carrying a substrate mounted on a substrate holder into a sputtering system; a second step of depositing the thin film on a surface of the substrate by the sputtering system; and a third step of carrying out the substrate holder mounting the substrate on which the thin film is deposited to outside of the sputtering system, wherein: the first step includes placing a mask member on the surface of the substrate fed from the outside of the sputtering system and mounted on the substrate holder to cover a partial region on the surface of the substrate and then carrying the mask member together with the substrate mounted on the substrate holder into the sputtering system; the second step includes depositing the thin film in that region on the surface of the substrate mounted on the substrate holder which is not covered with the mask member; and the third step includes taking out the mask member together with the substrate mounted on the substrate holder to the outside of the sputtering system and then carrying out only the substrate and the substrate holder.

The sputtering system according to the present invention is based on the premise that the sputtering system is a sputtering system for depositing a thin film, comprising: a thin film depositing section for depositing the thin film on a surface of a substrate by sputtering; and a substrate carrying-in and carrying-out section for carrying the substrate fed from outside of the thin film depositing section into the thin film depositing section and carrying out the substrate on which the thin film is deposited by the thin film depositing section to the outside of the thin film depositing section, wherein: a mask member is placed on the surface of the substrate mounted on a substrate holder to cover a partial region on the surface of the substrate, and the thin film is deposited by sputtering in a region on the surface of the substrate not covered with the mask member.

In the sputtering system according to the present invention, the substrate carrying-in and carrying-out section has substrate holder holding and releasing means performing mechanical holding and releasing of the substrate holder mounting the substrate, and mask member holding and releasing means performing mechanical holding and releasing of the mask member. In this case, the substrate carrying-in and carrying-out section carries the substrate holder mounting the substrate and the mask member into the thin film depositing section after the mask member has been placed on the surface of the substrate mounted on the substrate holder, takes out the substrate holder mounting the substrate on which the thin film is deposited and the mask member to the outside of the thin film depositing section, and then carries out only the substrate and the substrate holder, with the mask member being held thereby. By so doing, the mask member can also be taken out of the thin film depositing section at the time the substrate and the substrate holder are discharged from the thin film depositing section. For this reason, for example, a maintenance operation for cleaning the mask member is facilitated.

The sputtering system according to the present invention is a sputtering system for use in as a system for depositing a thin film on a disc-shaped substrate (disc substrate) having an opening portion defined centrally thereof in the manufacture of a disc, for example, a CD, a DVD, or the like. The substrate holder is provided with the cylindrical positioning section for positioning the substrate by being inserted through the opening portion of the substrate. The mask member comprises two masks: the annular inner mask covering the periphery of the opening portion of the substrate, and the annular outer mask covering the outer peripheral portion of the substrate. In this case, the inner mask is shaped annular and having the opening portion through which the positioning section of the substrate holder is inserted. With this feature, the opening portion of the disc substrate and the positioning section of the substrate holder allow the disc substrate to be positioned on the substrate holder easily and with high precision, for example, in mounting the disc substrate on the disc holder. In placing the inner mask on the surface of the disc substrate, the opening portion of the inner mask and the positioning section of the disk substrate allow the inner mask to be positioned on the substrate holder easily and with high precision. In placing the outer mask on the surface of the disc substrate, engagement of the outer mask with the outer periphery of the disc substrate makes it possible to position the outer mask on the substrate holder easily and with high precision. As a result, the disc substrate and the inner and outer masks can be positioned easily and with high precision.

The sputtering system according to the present invention performs holding and releasing of the substrate holder and holding and releasing of the mask member (comprising the inner mask and the outer mask) mechanically. At that time, the substrate holder holding and releasing means uses, for example, a chuck for holding or releasing the substrate holder by the inner peripheral surface of the positioning section of the substrate holder. The inner mask holding and releasing control means uses a chuck for holding or releasing the inner mask by the outer peripheral surface of the inner mask. The outer mask holding and releasing control means uses a chuck for holding or releasing the outer mask by the outer peripheral surface of the outer mask. In this case, the substrate carrying-in and carrying-out section is provided therein with the holding and releasing control means performing a control of switching between holding and releasing of the substrate holder by the substrate holder holding and releasing means and a control of switching between holding and releasing of the inner mask by the inner mask holding and releasing means. On the other hand, the thin film depositing section is provided therein with the holding and releasing control means performing a control of holding or releasing of the outer mask by the outer mask holding and releasing means. With such an arrangement, the disc substrate and the inner and outer masks can be carried into the thin film depositing section of the sputtering system with the precision of their relative positioning being kept high without using the magnetic force of the magnet. For this reason, the configuration of the disc substrate carrying-in and carrying-out section can be simplified.

In the sputtering system according to present invention, it is desirable that: the positioning section of the substrate holder have a groove in an inner peripheral surface thereof; and each of the inner mask and the outer mask have a groove in an outer peripheral surface thereof. It is also desirable that: the chuck for holding or releasing the substrate holder have a claw for engagement with the groove in the inner peripheral surface of the positioning section of the substrate holder; the chuck for holding or releasing the inner mask have a claw for engagement with the groove in the outer peripheral surface of the inner mask; and the chuck for holding or releasing the outer mask have a claw for engagement with the groove in the outer peripheral surface of the outer mask. With this arrangement, the substrate holder and the inner and outer masks can be held more reliably.

The method for depositing a thin film on a disc-shaped disc substrate for use in a CD or a DVD for example by using the sputtering system according to the present invention is summarized as follows.

That is, the method for depositing a thin film comprises: a first step of carrying a substrate mounted on a substrate holder into a sputtering system; a second step of depositing the thin film on a surface of the substrate by the sputtering system; and a third step of carrying out the substrate holder mounting the substrate on which the thin film is deposited to outside of the sputtering system, wherein: the first step includes placing a mask member on the surface of the substrate fed from the outside of the sputtering system and mounted on the substrate holder to cover a partial region on the surface of the substrate and then carrying the mask member together with the substrate mounted on the substrate holder into the sputtering system; the second step includes depositing the thin film in that region on the surface of the substrate mounted on the substrate holder which is not covered with the mask member; and the third step includes taking out the mask member together with the substrate mounted on the substrate holder to the outside of the sputtering system and then carrying out only the substrate and the substrate holder.

While it is desirable that the present invention be applied to a sputtering system for depositing a thin film on a disc-shaped disc substrate for use in a CD or a DVD for example, the present invention is not limited to such an application and it is needless to say that the present invention is applicable to any sputtering system for depositing a thin film on a substrate by a similar method.

It is also needless to say that the present invention is applicable not only to a sputtering system but also to any system which can deposit a thin film based on a principle similar to sputtering.

Figure 1:
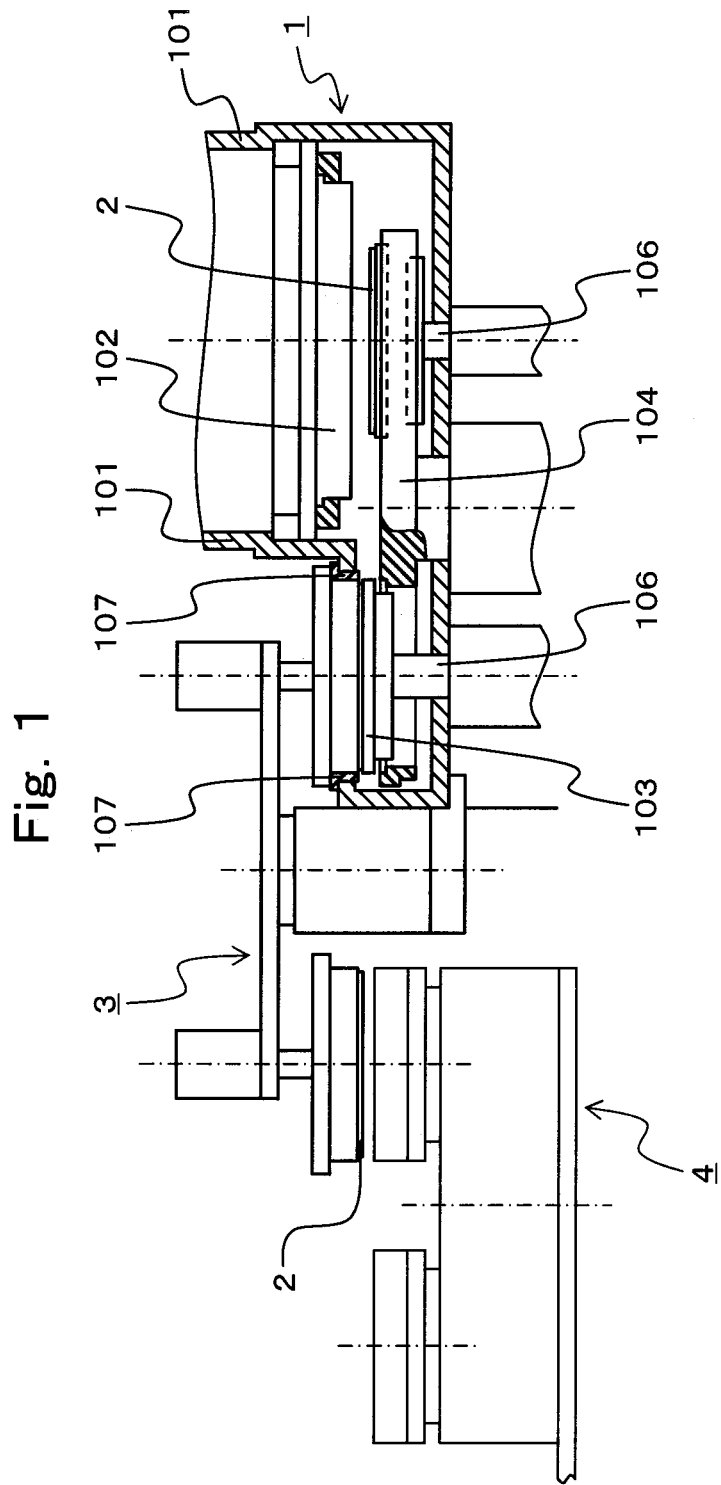
FIG. 1 is a schematic view showing a general configuration of a sputtering system according to one embodiment of the present invention.

DESCRIPTION OF SYMBOLS 1 thin film depositing section
101 vacuum chamber
102 target
103 disc receiving tray
104 disc carrier
105 load lock pusher
106 sputter pusher
107 load lock room flange
2 disc substrate
201 opening portion
3 disc substrate carrying-in and carrying-out section
301 substrate holder chuck
302 substrate holder chuck opening/closing roller
303 inner mask chuck
304 inner mask chuck opening roller
305 inner mask chuck closing spring
306 outer mask chuck
307 outer mask chuck opening roller
308 outer mask chuck closing spring
309 chuck closing cam
310a, 310b chuck opening cam
311 load lock room cover flange
312 load lock room cover flange raising and lowering drive source
313 chuck opening/closing drive shaft
314 chuck opening/closing drive source
315 plate
316 guide shaft
4 disc substrate exchange unit
5 substrate holder
501 positioning section
501a substrate holder holding groove
601 inner mask
601a groove
602 outer mask
602a groove

BEST MODE FOR CARRYING OUT THE INVENTION

Hereinafter, the present invention will be described in detail by way of an embodiment with reference to the drawings.

Throughout all the drawings for illustration of the embodiment, like reference characters designate like parts having like functions for the purpose of omitting repeated descriptions thereof.

A sputtering system according to the present invention feeds a substrate to be subjected to thin film deposition, as mounted on a substrate holder, picks up the substrate and the substrate holder by a substrate carrying-in and carrying-out section holding a mask member, and carries the substrate mounted on the substrate holder and having the mask placed thereon into the sputtering system (thin film depositing section). When carrying out the substrate having the thin film deposited thereon to the outside of the sputtering system (thin film depositing section), the substrate carrying-in and carrying-out section takes out the substrate holder mounting the substrate and the mask member placed on the substrate and then discharges only the substrate and the substrate holder with the mask member being held by the substrate carrying-in and carrying-out section.

EMBODIMENT

FIG. 1 is a schematic view showing a general configuration of a sputtering system according to one embodiment of the present invention.

The sputtering system according to the present embodiment is a thin film depositing system for use in the step of depositing a thin film on a disc-shaped disc substrate in the manufacture of a disc-shaped disc, for example, a CD, a DVD, or the like. As shown in FIG. 1, the sputtering system comprises a thin film depositing section 1 for depositing a thin film on a surface of a disc substrate, and a disc substrate carrying-in and carrying-out section 3 for carrying the disc substrate 2 fed from the outside of the system into the thin film depositing section 1 and discharging the disc substrate 2 having the thin film deposited thereon by the thin film depositing section 1 to the outside of the system. The disc substrate 2 to be subjected to thin film deposition is fed from a disc exchange unit 4, and the disc substrate 2 having the thin film deposited thereon is carried out to the disc exchange unit 4.

The thin film depositing section 1 comprises, for example, a vacuum chamber 101, a target 102 placed inside the vacuum chamber 101, a disc receiving tray 103, a disc carrier 104, a load lock pusher 105, a sputter pusher 106, and the like.

Though not shown, the thin film depositing section 1 has other components including, for example, a magnet and cooling means placed on the reverse side of the target 102, and gas feeding and discharging sections for electrical discharge.

The vacuum chamber 101 has an opening portion for carrying-in and carrying-out of the disc substrate 2. The outer periphery of the opening portion is provided with a load lock room flange 107.

The configuration and operation of the thin film depositing section 1 and those of the disc substrate carrying-in and carrying-out section 3 will be described later. Now, description will be made of the configuration of the disc substrate 2 to be subjected to thin film deposition by the sputtering system of the present embodiment, the configurations of the masks, and the like.

Figure 2:
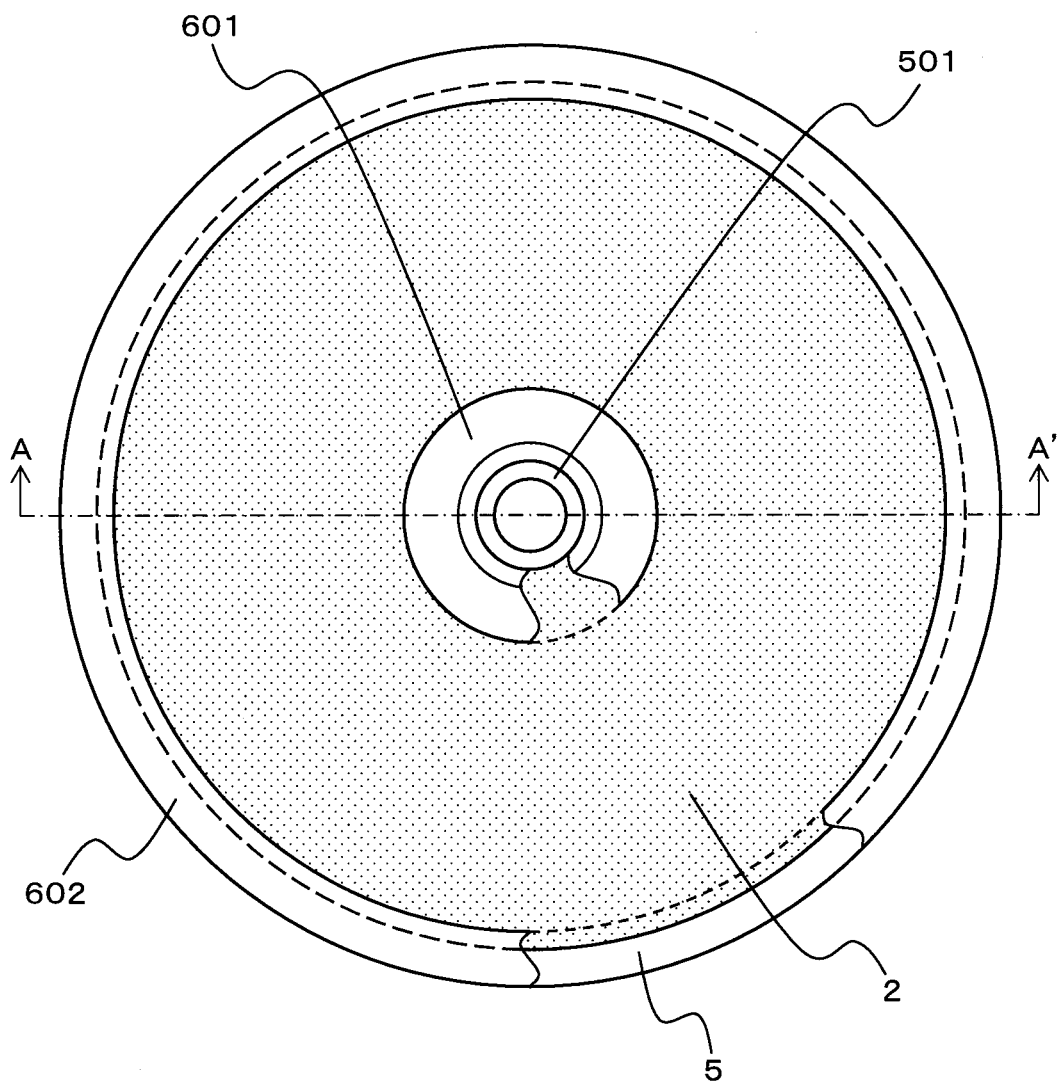
FIG. 2 is a schematic plan view showing a general configuration of a substrate on which a thin film is to be deposited by the sputtering system according to the embodiment, and general configurations of a substrate holder and masks.
Figure 3:
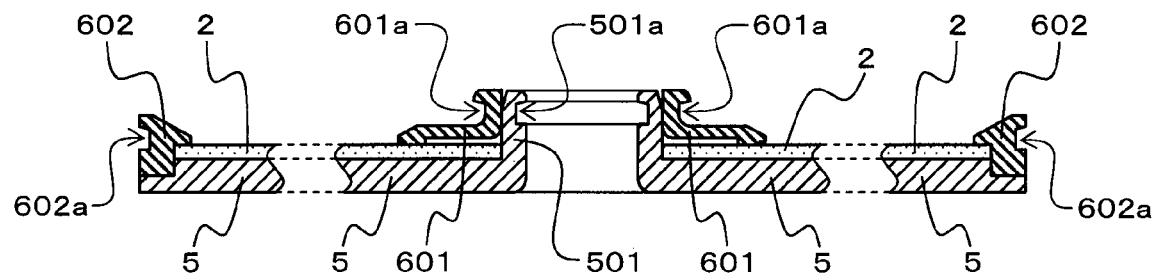
FIG. 3 is a schematic sectional view taken on line A-A' of FIG. 2.
Figure 4:
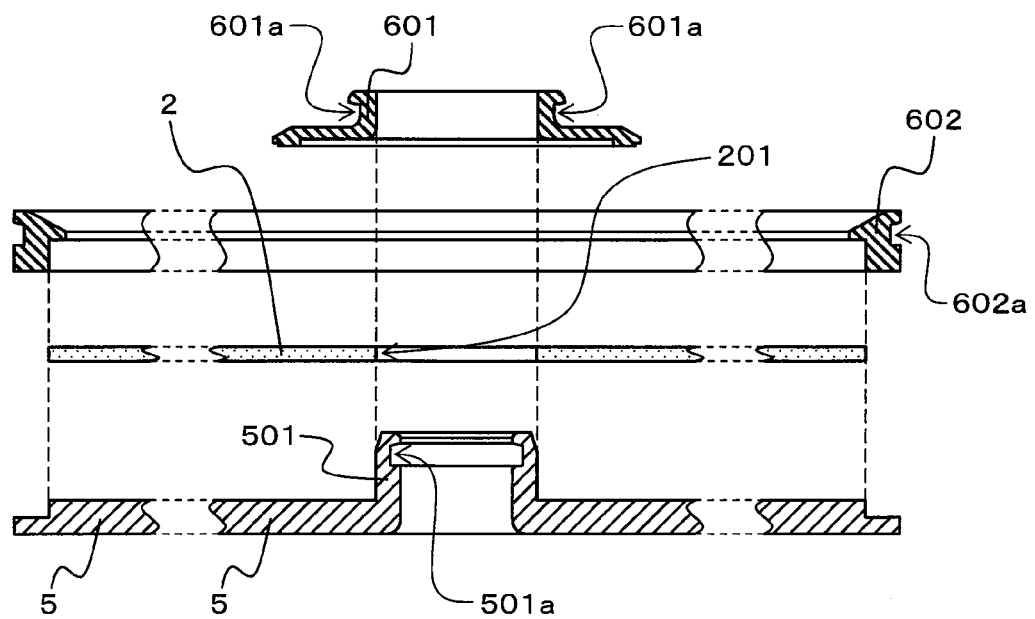
FIG. 4 is a schematic sectional view as exploded from FIG. 3.

FIG. 2 is a schematic plan view showing a general configuration of a substrate to be subjected to thin film deposition by the sputtering system according to the present embodiment, and general configurations of a substrate holder and masks. FIG. 3 is a schematic sectional view taken on line A-A' of FIG. 2. FIG. 4 is a schematic sectional view as exploded from FIG. 3.

The disc substrate 2 to be subjected to thin film deposition by the sputtering system according to the present embodiment is, for example, a disc-shaped substrate having a circular opening portion 201 defined centrally thereof as shown in FIGS. 2 to 4. In depositing a thin film on a surface of the disc substrate 2 by the sputtering system according to the present embodiment, as shown in FIGS. 2 and 3, the disc substrate 2 in a state in which the disc substrate 2 is mounted on a substrate holder 5 and, further, an inner mask 601 and an outer mask 602 are placed on the disc substrate 2, is carried into the thin film depositing section 1 of the sputtering system. In carrying out the disc substrate 2 after deposition of the thin film on the surface of the disc substrate 2, the disc substrate 2 in a state in which the disc substrate 2 is mounted on the substrate holder 5 and, further, the inner mask 601 and the outer mask 602 are placed on the disc substrate 2, is carried out to the outside of the thin film depositing section 1 of the sputtering system.

The substrate holder 5 has a cylindrical positioning section 501 to be inserted through the opening portion 201 of the disc substrate 2. The positioning section 501 has an outer diameter set equal to the diameter of the opening portion 201 of the disc substrate for example. The positioning section 501 is provided with, for example, a circumferential groove (i.e., substrate holder holding groove) 501a in an inner peripheral surface thereof.

The inner mask 601 is a mask member covering the periphery of the opening portion 201 of the disc substrate 2 and is shaped annular with an opening portion through which the positioning section 501 of the substrate holder 5 is inserted. The inner mask 601 is provided with, for example, a circumferential groove 601a in an outer peripheral surface thereof.

The outer mask 602 is a mask member covering an outer peripheral portion of the disc substrate 2 and is shaped annular for engagement with the outer periphery of the substrate holder 5. The outer mask 602 is provided with, for example, a circumferential groove 602a in an outer peripheral surface thereof.

The disc substrate 2, substrate holder 5, inner mask 601 and outer mask 602 are in contact with each other physically, but can be separated from each other easily as shown in FIG. 4.

The following description is directed to the configuration of the disc substrate carrying-in and carrying-out section 3 operating in depositing the thin film on the surface of the disc substrate 2 by the sputtering system according to the present embodiment using the disc substrate 2, substrate holder 5, inner mask 601 and outer mask 602 as shown in FIGS. 2 to 4.

Figure 5:
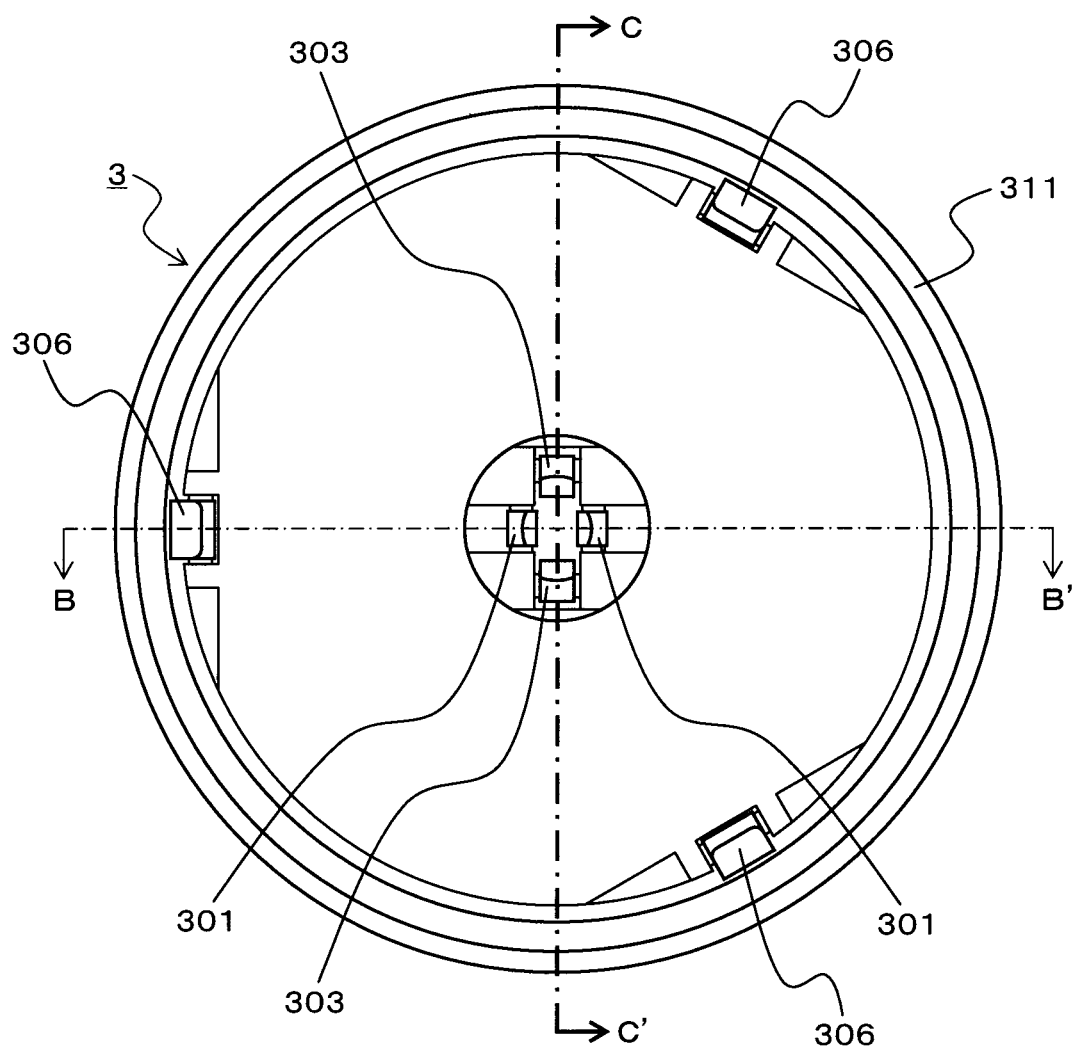
FIG. 5 is a schematic plan view showing a disc substrate carrying-in and carrying-out section according to the embodiment as viewed from a disc substrate holding side.
Figure 6:
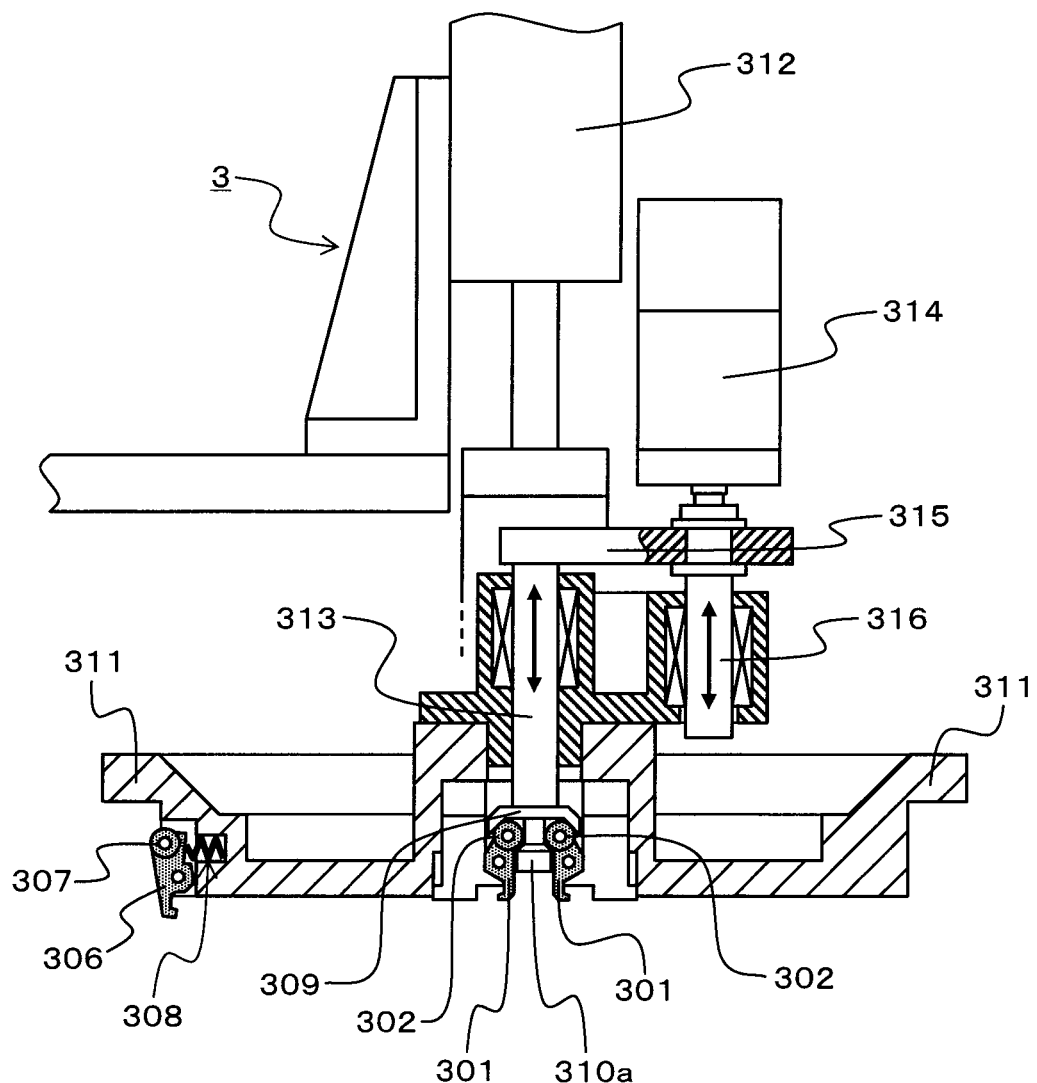
FIG. 6 is a schematic sectional view taken on line B-B' of FIG. 5.
Figure 7:
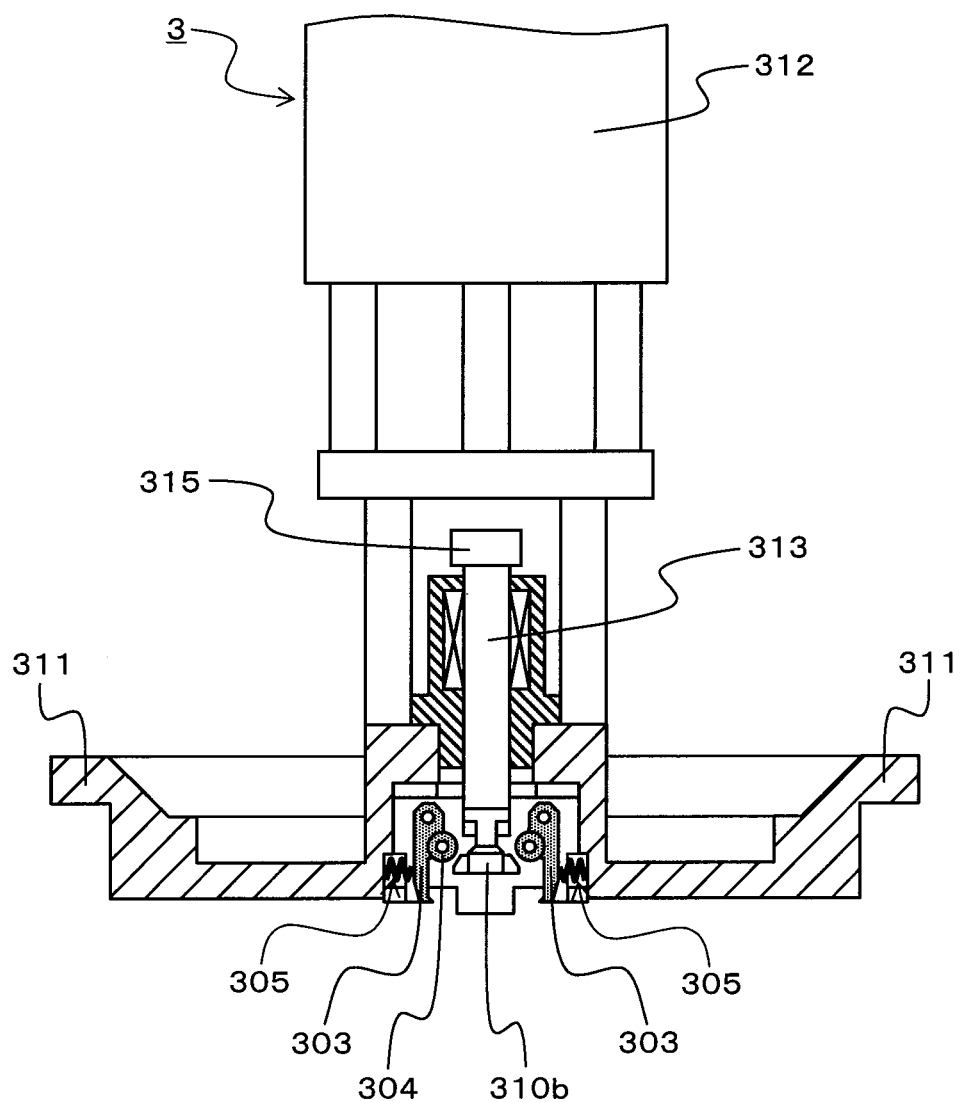
FIG. 7 is a schematic sectional view taken on line C-C' of FIG. 5.

FIGS. 5 to 7 are schematic views showing an exemplary configuration of the disc substrate carrying-in and carrying-out section of the sputtering system according to the present embodiment. FIG. 5 is a schematic plan view showing the disc substrate carrying-in and carrying-out section according to the embodiment as viewed from the disc substrate holding side. FIG. 6 is a schematic sectional view taken on line B-B' of FIG. 5. FIG. 7 is a schematic sectional view taken on line C-C' of FIG. 5.

In the sputtering system according to the present embodiment, the disc substrate carrying-in and carrying-out section 3 comprises, for example: a substrate holder chuck 301 and a substrate holder chuck opening/closing roller 302; an inner mask chuck 303, an inner mask chuck opening roller 304 and an inner mask chuck closing spring 305; an outer mask chuck 306, an outer mask chuck opening roller 307 and an outer mask chuck closing spring 308; a chuck closing cam 309 and chuck opening cams 310a and 310b; a load lock room cover flange 311 and a load lock room cover flange raising and lowering drive source 312; a chuck opening/closing drive shaft 313 and a chuck opening/closing drive source 314; and other components.

The substrate holder chuck 301 and the substrate holder chuck opening/closing roller 302 form holding and releasing means performing holding and releasing of the substrate holder 5. Switching between holding and releasing of the substrate holder 5 is made by up-and-down movements of the chuck closing cam 309 and chuck opening cam 310a. The substrate holder chuck 301 has a claw for engagement with the substrate holder holding groove 501a formed in the inner peripheral surface of the positioning section 501 of the substrate holder 5.

The inner mask chuck 303 and the inner mask chuck opening roller 304 form holding and releasing means performing holding and releasing of the inner mask 601. Switching between holding and releasing of the inner mask 601 is made by up-and-down movements of the chuck opening cam 310b and an action of the inner mask chuck closing spring 305 located between the load lock room cover flange 311 and the inner mask chuck 303. The inner mask chuck 303 has a claw for engagement with the groove 601a formed in the outer peripheral surface of the inner mask.

The chuck closing cam 309 and the chuck opening cams 310a and 310b are linked to the chuck opening/closing drive shaft 313, which in turn is fixed to a guide shaft 316 connected to the chuck opening/closing drive source 314 by means of a plate 315. Thus, the chuck opening/closing drive shaft 313, chuck closing cam 309 and chuck opening cams 310a and 310b move up and down along with up-and-down movements of the guide shaft 316 caused by the chuck opening/closing drive source 314.

The chuck closing cam 309 and the chuck opening cams 310a and 310b are arranged so as to be capable of switching between the following three states in relation to the opening/closing of the substrate holder chuck 301 and the opening/closing of the inner mask chuck 303 when necessary. The first state is a state in which the substrate holder chuck 301 is open while the inner mask chuck 303 is closed to hold the inner mask 601. The second state is a state in which the substrate holder chuck 301 is closed to hold the substrate holder 5 while the inner mask chuck 303 is closed to hold the inner mask 601. The third state is a state in which the substrate holder chuck 301 and the inner mask chuck 303 are both open. In order to realize these three states, the chuck opening cam 310a for opening the substrate holder chuck and the chuck opening cam 310b for opening the inner mask chuck 303 are simply shifted vertically from each other for example.

The outer mask chuck 306 and the outer mask chuck opening roller 307 form holding and releasing means performing holding and releasing of the outer mask 602. Switching between holding and releasing of the outer mask 602 is made by the outer mask chuck closing spring 308 located between the load lock room cover flange 311 and the outer mask chuck 306. Specifically, the outer mask chuck 306 in a normal condition is closed to hold the outer mask 602. When, for example, the outer mask chuck opening roller 307 is pushed by the load lock room flange 107 for example, the outer mask chuck 306 is switched to an open state.

Description will be made of operations of the disc substrate carrying-in and carrying-out section 3 and thin film depositing section 1 in depositing the thin film on the disc substrate by the sputtering system according to the present embodiment, as well as the configuration of the thin film depositing section 1.

Figure 8:
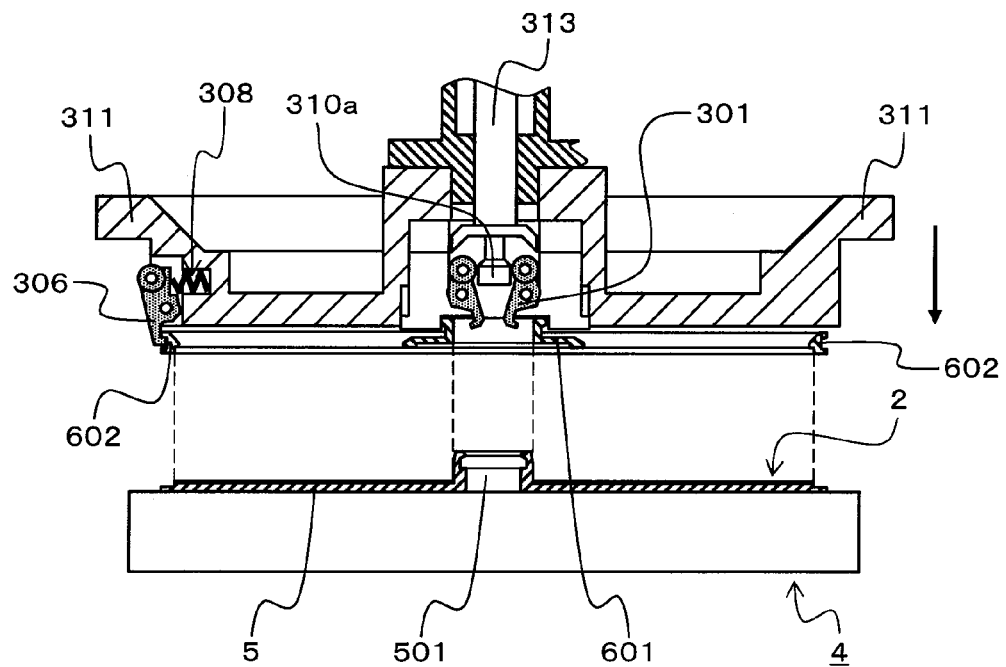
FIG. 8 is a schematic sectional view showing a state before a disc substrate to be fed from a disc substrate exchange unit is picked up.
Figure 9:
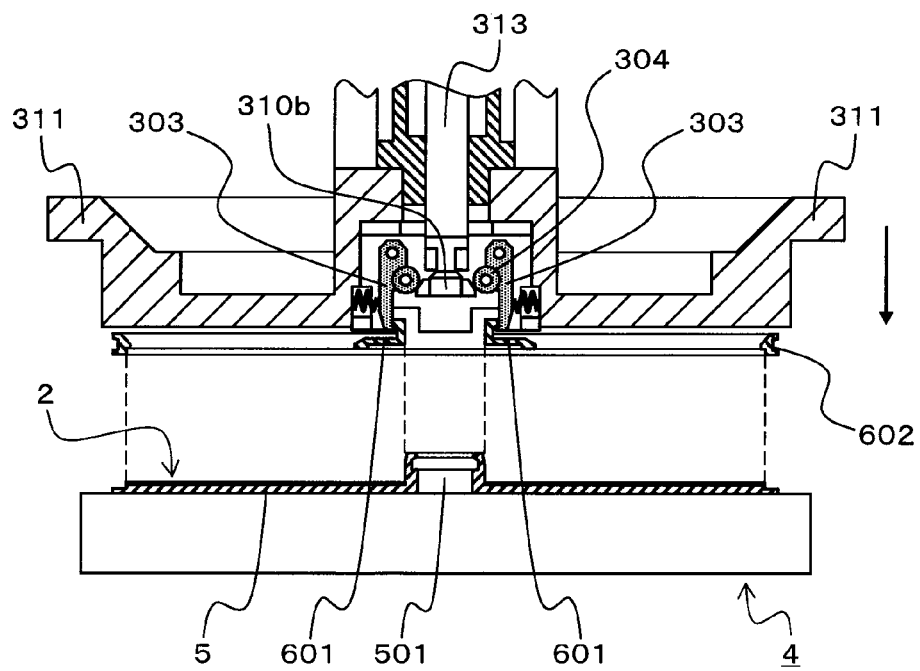
FIG. 9 is a schematic sectional view showing a state before the disc substrate to be fed from the disc substrate exchange unit is picked up.
Figure 10:
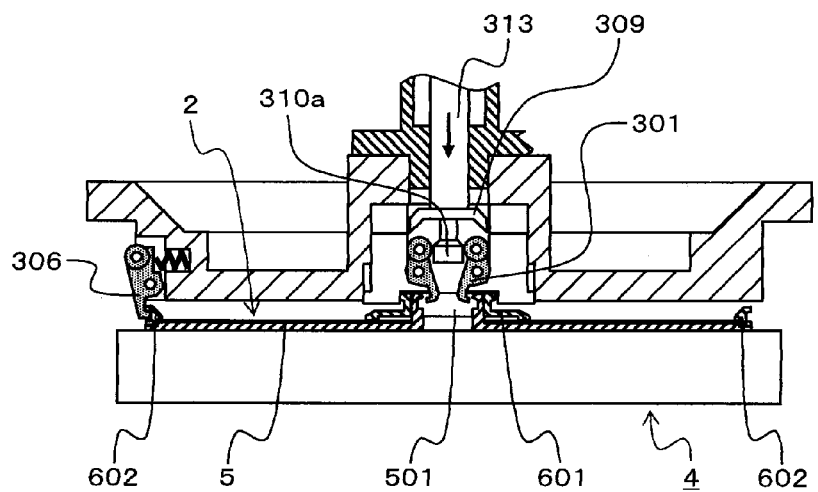
FIG. 10 is a schematic sectional view showing a state in which an inner mask and an outer mask are placed on the disc substrate fed from the disc substrate exchange unit.
Figure 11:
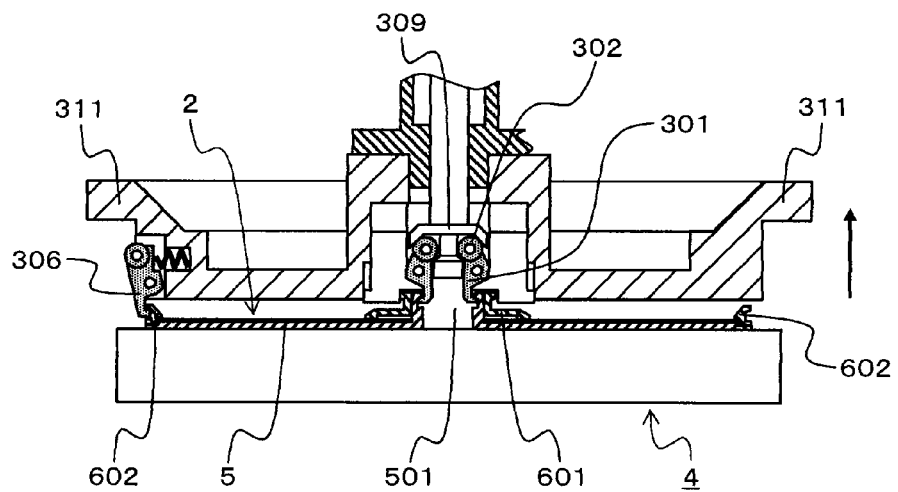
FIG. 11 is a schematic sectional view showing a state in which a substrate holder is held.
Figure 12:
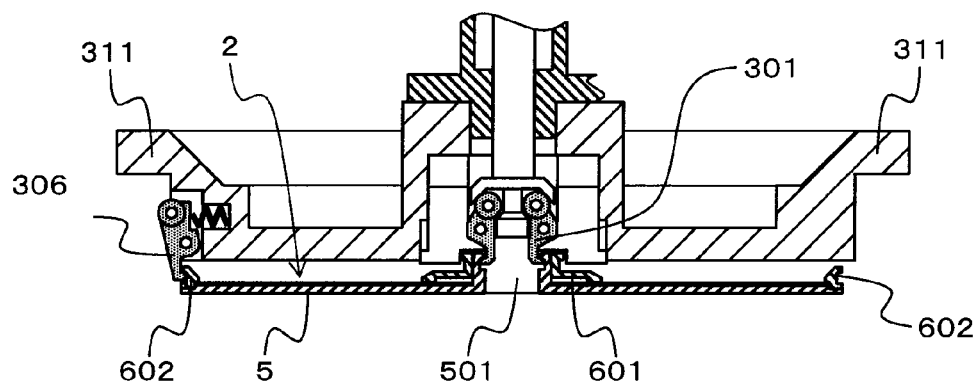
FIG. 12 is a schematic sectional view showing a state after the disc substrate and the substrate holder have been picked up from the disc substrate exchange unit.
Figure 13:
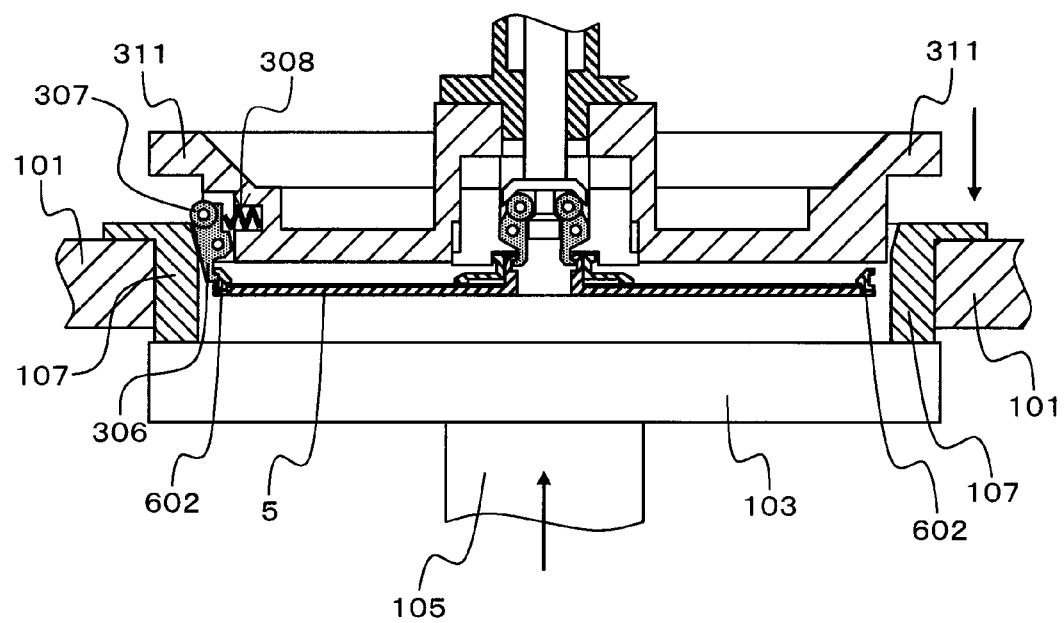
FIG. 13 is a schematic sectional view showing a state in inserting the disc substrate into a load lock room flange of a thin film depositing section.
Figure 14:
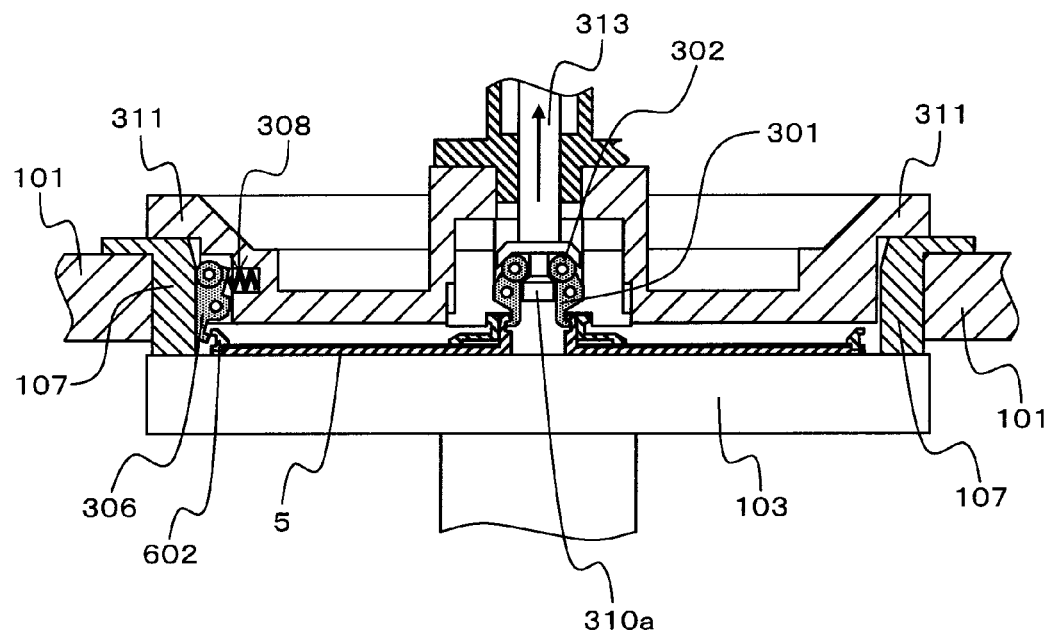
FIG. 14 is a schematic sectional view showing a state in which the disc substrate is inserted into the load lock room flange of the thin film depositing section.
Figure 15:
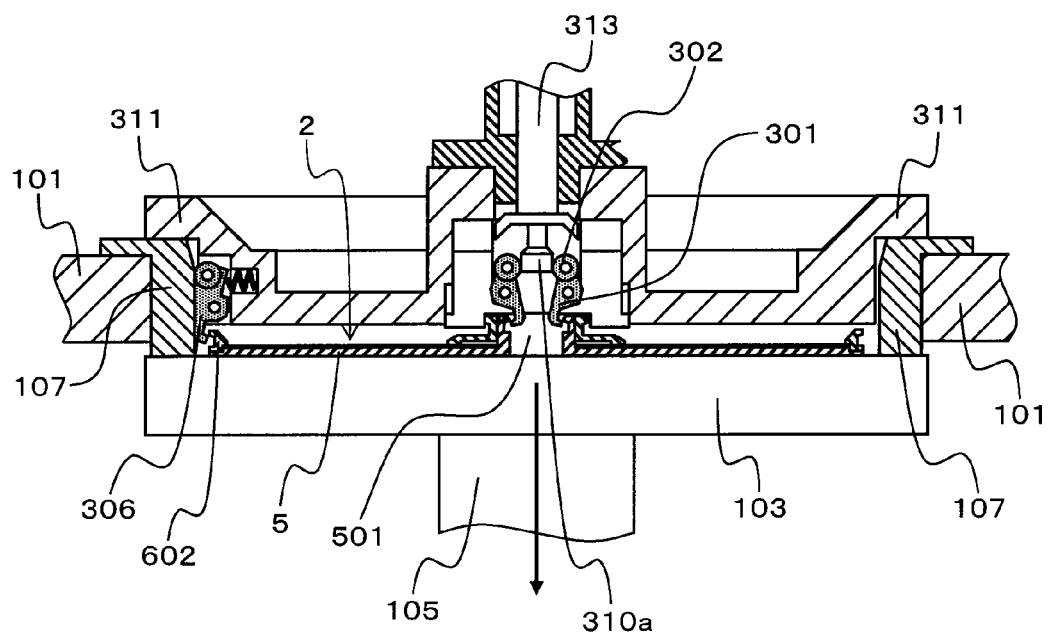
FIG. 15 is a schematic sectional view showing a state in carrying the disc substrate and the substrate holder into the thin film depositing section.
Figure 16:
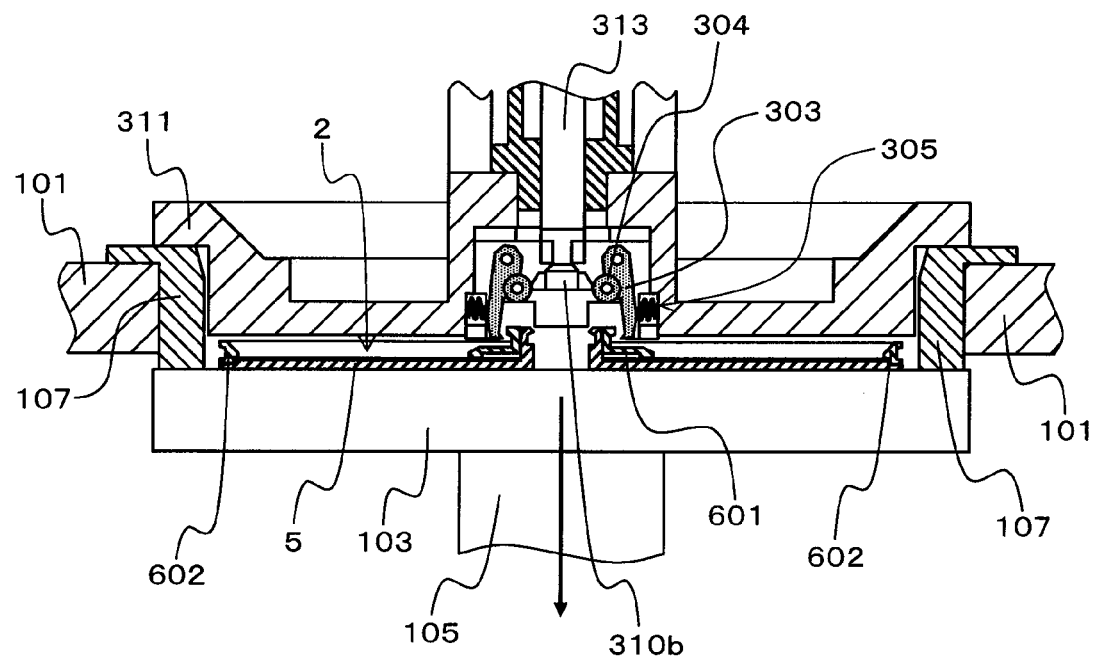
FIG. 16 is a schematic sectional view showing a state in carrying the disc substrate and the substrate holder into the thin film depositing section.
Figure 17:
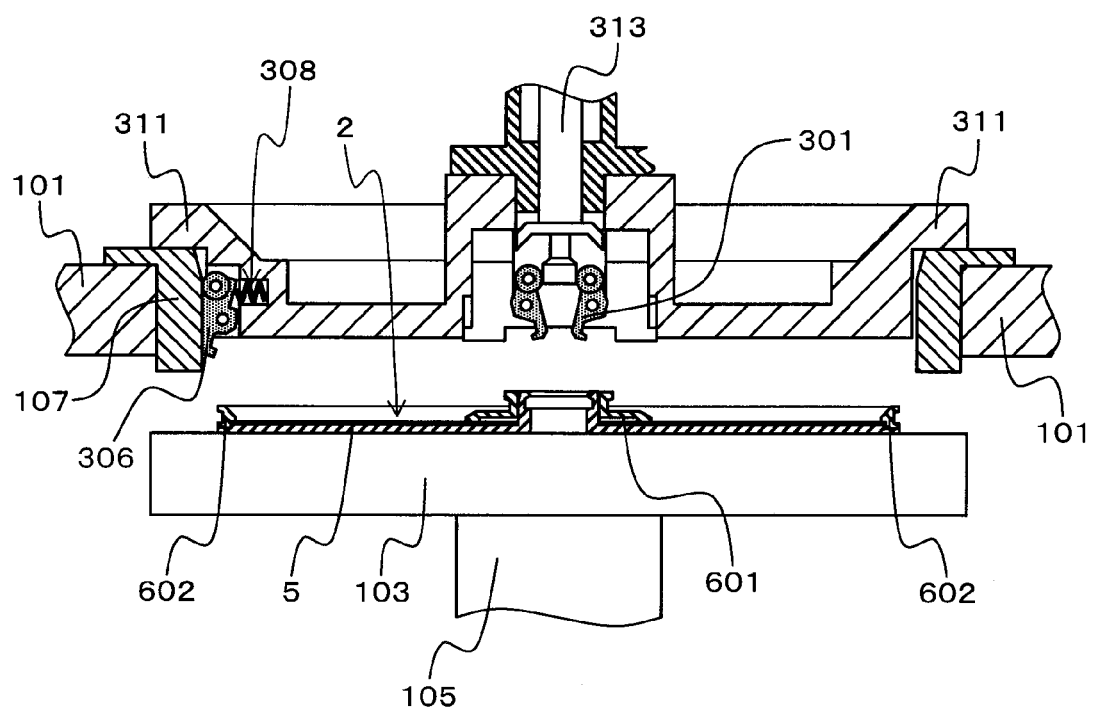
FIG. 17 is a schematic sectional view showing a state after the disc substrate and the substrate holder have been carried into the thin film depositing section.

FIGS. 8 to 17 are schematic sectional views for illustrating the operation of the disc substrate carrying-in and carrying-out section in depositing the thin film on the disc substrate by the sputtering system according to the present embodiment. FIGS. 8 and 9 are each a schematic sectional view showing a state before the disc substrate to be fed from the disc substrate exchange unit is picked up. FIG. 10 is a schematic sectional view showing a state in which the inner mask and the outer mask are placed on the disc substrate fed from the disc substrate exchange unit. FIG. 11 is a schematic sectional view showing a state in which the substrate holder is held. FIG. 12 is a schematic sectional view showing a state after the disc substrate and the substrate holder have been picked up from the disc substrate exchange unit. FIGS. 13 and 14 are each a schematic sectional view showing a state in inserting the disc substrate into the load lock room flange of the thin film depositing section. FIGS. 15 and 16 are each a schematic sectional view showing a state in carrying the disc substrate and the substrate holder into the thin film depositing section. FIG. 17 is a schematic sectional view showing a state after the disc substrate and the substrate holder have been carried into the thin film depositing section.

FIGS. 8, 10 to 15 and 17 are sectional views in the same section as FIG. 6. FIGS. 9 and 16 are sectional views in the same section as FIG. 7.

In depositing the thin film on the disc substrate 2 by the sputtering system according to the present embodiment, the disc substrate 2 as mounted on the substrate holder 5 is fed from the disc substrate exchange unit 4 as shown in FIGS. 8 and 9 for example. At that time, the disc substrate carrying-in and carrying-out section 3 is in a state of holding the inner mask 601 and the outer mask 602 by the inner mask chuck 303 and the outer mask chuck 306, respectively. The substrate holder chuck 301 is in an open state.

Subsequently, the opening portion of the inner mask 601 and the positioning section 501 of the substrate holder 5 are positioned relative to each other and then, for example, the load lock room cover flange 311 is lowered to place the inner mask 601 and the outer mask 602 on the disc substrate 3 as shown in FIG. 10. In this state, the substrate holder chuck 301 is in an open state. For this reason, by subsequently lowering the chuck opening/closing drive shaft 313 to cause the chuck closing cam 309 to push the substrate holder opening/closing roller 302 inwardly, the claw of the substrate holder chuck 301 engages the substrate holder holding groove 501a in the inner peripheral surface of the positioning section 501 of the substrate holder 5, to hold the substrate holder 5 as shown in FIG. 11. Thereafter, by raising the load lock room cover flange 311 for example, the inner and outer masks 601 and 602 and the substrate holder 5 mounting the disc substrate 2 become held by the disc substrate carrying-in and carrying-out section 3. With this state being kept, the load lock room cover flange 311 of the disc substrate carrying-in and carrying-out section 3 is moved to above the opening portion (load lock room flange 107) of the thin film depositing section 1. At that time, the disc substrate 2 and inner mask 601 mounted on the substrate holder 5 move as positioned relative to each other with high precision by the positioning section 501 of the substrate holder 5. Also, the disc substrate 2 and outer mask 602 mounted on the substrate holder 5 move as positioned relative to each other with high precision by engagement of the outer mask 602 with the outer periphery of the substrate holder 5.

After the load lock room cover flange 311 of the disc substrate carrying-in and carrying-out section 3 holding the inner and outer masks 601 and 602 and the substrate holder 5 mounting the disc substrate 2 has been moved to above the opening portion (load lock room flange 107) of the thin film depositing section 1, the load lock room cover flange 311 of the disc substrate carrying-in and carrying-out section 3 is lowered and inserted into the opening portion of the thin film depositing section 1 as shown in FIG. 13. At that time, the outer mask chuck opening roller 307 is brought into contact with the load lock room flange 107 provided on the outer periphery of the opening portion of the thin film depositing section 1. When the load lock room cover flange 311 is completely inserted into the load lock room flange 107, the outer mask chuck 306 assumes an open state as shown in FIG. 14. Since the load lock room flange 107 and the load lock room cover flange 311 are brought into intimate contact with each other at that time, the vacuum chamber 101 is evacuated by a vacuum pump to turn the interior of the vacuum chamber 101 into a high vacuum condition.

In inserting the load lock room cover flange 311 into the load lock room flange 107, the disc receiving tray 103 placed inside the thin film depositing section 1 is positioned at a height at which, for example, the load lock room cover flange 311 is completely inserted as shown in FIGS. 13 and 14. The height of the disc receiving tray 103 is controlled by the load lock pusher 105 positioned to overlap the opening portion of the thin film depositing section 1.

At the time the load lock room cover flange 311 is completely inserted into the load lock room flange 107, the substrate holder 5 is in a state of being held by the substrate holder chuck 301 as shown in FIG. 14. Likewise, the inner mask 601 is in a state of being held by the inner mask chuck 303, though not shown. For this reason, when the chuck opening/closing drive shaft 313 and the chuck opening cams 310a and 310b are raised, the chuck opening cam 310a on the substrate holder chuck 301 side first comes into contact with the substrate holder chuck opening/closing roller 302 to cause the substrate holder chuck 301 to open as shown in FIG. 15 for example. When the chuck opening/closing drive shaft 313 is raised continuously, the chuck opening cam 310b on the inner mask chuck 303 side comes into contact with the inner mask chuck opening roller 304 to cause the inner mask chuck 303 to open as shown in FIG. 16 for example.

When the load lock pusher 105 is lowered to lower the disc receiving tray 103 after the substrate holder chuck 301, inner mask chuck 303 and outer mask chuck 306 have assumed their open states, the disc substrate 2 which is mounted on the substrate holder 5 and on which the inner mask 601 and outer mask 602 are placed is carried into the thin film depositing section 1 as shown in FIG. 17. At that time, the disc substrate 2 and the inner mask 601 mounted on the substrate holder 5 are in a state of being positioned relative to each other with high precision by the positioning section 501 of the substrate holder 5. Similarly, the disc substrate 2 and the outer mask 602 mounted on the substrate holder 5 are in a state of being positioned relative to each other with high precision by engagement of the outer mask 602 with the outer periphery of the substrate holder 5.

When the disc receiving tray 103 is lowered together with the load lock pusher 105, the disc receiving tray 103 becomes mounted on the disc carrier 104 on the way. The disc carrier 104 mounting the disc receiving tray 103 rotates to move the disc receiving tray 103 into a position facing the target 102. At that time, the sputter pusher 106 is positioned under the disc receiving tray 103. The sputter pusher 106 is then raised to lift the disc receiving tray 103 so as to provide a predetermined spacing between the disc substrate 2 on the disc receiving tray 103 and the target 102. Even at that time, the disc substrate 2 and the inner mask 601 mounted on the substrate holder 5 are in a state of being positioned relative to each other with high precision by the positioning section 501 of the substrate holder 5 without depending on the precision of rotation of the disc carrier 104. Similarly, the disc substrate 2 and the outer mask 602 mounted on the substrate holder 5 are in a state of being positioned relative to each other with high precision by engagement of the outer mask 602 with the outer periphery of the substrate holder 5.

When the spacing between the disc substrate 2 on the disc receiving tray 103 and the target 102 reaches the predetermined spacing, for example, an electric field and a magnetic field are applied between the disc substrate 2 and the target 102 under heating and a gas for electrical discharge is introduced to produce plasma. Plasma thus produced is caused to collide with the target 102 thereby sputtering atoms or molecules from the target. The atoms or molecules thus sputtered are deposited on the surface of the disc substrate 2 to form the thin film. Since the inner mask 601 and outer mask 602 on the disc substrate 2 are positioned with high precision at that time, there is no need to perform positioning of the masks again within the thin film depositing section 1. For this reason, it is possible to deposit the thin film with high positional precision easily.

After thin film deposition on the surface of the disc substrate 2, the disc substrate 2, substrate holder 6, inner mask 601 and outer mask 602 are carried out to the outside of the thin film depositing section 1 by a procedure reverse of the above-described procedure. Specifically, first, the sputter pusher 106 is lowered to lower the disc receiving tray 103 thereby to mount the disc receiving tray 103 on the disc carrier 104. Subsequently, the disc carrier 104 is rotated to return the disc receiving tray 103 to the load lock room side. In turn, the load lock pusher 105 is raised to lift the disc receiving tray 103 to a height that allows the substrate holder 5 and the inner mask 601 on the disc receiving tray 103 to be held by the substrate holder chuck 301 and the inner mask chuck 303, respectively, as shown in FIGS. 15 and 16. Subsequently, by lowering the chuck opening/closing drive shaft 313 of the disc substrate carrying-in and carrying-out section 3, the chuck opening cam 310b on the inner mask chuck 303 side first comes off the inner mask chuck opening roller 304 to cause the inner mask chuck opening spring 305 to expand, so that the claw of the inner mask chuck 303 engages the groove 601a of the inner mask 601, thereby holding the inner mask 601. By continuing to lower of the chuck opening/closing drive shaft 313, the chuck closing cam 309 comes into contact with the substrate holder chuck opening/closing roller 302 to cause the claw of the substrate holder chuck 301 to engage the substrate holder holding groove 501a of the substrate holder 5, thereby holding the substrate holder 5.

Subsequently, the load lock room is turned back into the atmospheric condition, and the load lock room cover flange 311 of the disc substrate carrying-in and carrying-out section 3 is raised to come off the opening portion (load lock room flange 107) of the thin film depositing section. By so doing, the outer mask chuck closing spring 308 expands to cause the claw of the outer mask chuck 306 to engage the groove 602a of the outer mask 602, thereby holding the outer mask 602.

Subsequently, after the disc substrate carrying-in and carrying-out section 3 has been moved to above the disc substrate exchange unit 4, the chuck opening/closing drive shaft 313 is raised to realize a state in which only the substrate holder chuck 301 is in an open state as shown in FIGS. 9 and 10 for example. By so doing, only the disc substrate 2 having the thin film deposited thereon and the substrate holder 5 can be carried out to the disc substrate exchange unit 4. By repeating this operation thereafter, such a thin film is deposited on each of disc substrates 2 sequentially fed from the disc substrate exchange unit 4.

Since the inner mask 601 and the outer mask 602 are used in thin film deposition on the disc substrate 2, the thin film is deposited also on the masks as on the disc substrate 2. For this reason, maintenance is necessary for the inner mask 601 and outer mask 602 to be cleaned periodically.

When the disc substrate carrying-in and carrying-out section 3 is positioned above the disc substrate exchange unit 4 for example, the outer mask chuck 306 and the outer mask chuck opening roller 307 are exposed on a side surface of the load lock room cover flange 311. Therefore, the outer mask 602 can be removed easily by pushing the outer mask chuck opening roller 307. Also, since the inner mask chuck 303 can be opened by raising the chuck opening/closing drive shaft 313, the inner mask 601 can also be removed easily. Thus, the sputtering system according to the present embodiment allows maintenance including cleaning of the inner mask 601 and outer mask 602 to be performed easily. If, for example, titanium is used as the material of the inner and outer masks 601 and 602, the thin film deposited on the masks by sputtering can be cleaned off easily by nitric acid.

As has been described above, the sputtering system according to the present embodiment uses the substrate holder 5 having the cylindrical positioning section 501 and performs positioning of the substrate holder 5 and the disc substrate 2 relative to each other as well as positioning of the substrate holder 5 and the inner mask 601 relative to each other by utilizing the positioning section 501, thereby making it possible to position the disc substrate 2 and the inner mask 601 relative to each other with high precision. Also, the sputtering system performs positioning of the substrate holder 5 and the outer mask 602 relative to each other by engagement of the outer mask 602 with the outer periphery of the substrate holder 5, thereby making it possible to position the disc substrate 2 and the outer mask 602 relative to each other with high precision.

Since the operation of placing the inner mask 601 and the outer mask 602 on the disc substrate 2 mounted on the substrate holder 5 and the operation of removing the inner mask 601 and the outer mask 602 placed on the disc substrate 2 having the thin film deposited thereon are performed at a place outside the thin film depositing section 1 (vacuum chamber 101), maintenance of the inner mask 601 and outer mask 602 becomes easy.

Holding and releasing (removal) of the inner mask 601 and outer mask 602 are performed mechanically by the chucks, chuck opening/closing rollers, chuck opening/closing drive shaft and the like provided in the disc substrate carrying-in and carrying-out section 3. Therefore, there is no need to provide a mechanism for holding and releasing the inner mask and the outer mask by utilizing a magnet (magnetic force) for example, or a like mechanism. Thus, the configuration of the disc substrate carrying-in and carrying-out section 3 can be simplified.

While the present invention has been described specifically based on the foregoing embodiment, it is obvious that the present invention is not limited to the foregoing embodiment but may be modified variously without departing from the concept thereof.

While the foregoing embodiment is directed to the sputtering system for example, it is obvious that the present invention is not limited thereto but may be applied to any system which is configured to deposit a thin film on the same principle as sputtering while using a mask as placed on a substrate such as a disc substrate.

The invention claimed is:

1. A sputtering system for depositing a thin film, comprising:
   a thin film depositing section for depositing the thin film on a surface of a substrate; and a substrate carrying-in and carrying-out section for carrying the substrate from outside of the sputtering system for depositing the thin film into the thin film depositing section and carrying out the substrate on which the thin film is deposited by the thin film depositing section to the outside of the sputtering system for depositing a thin film, wherein:
   a mask member is placed on the surface of the substrate mounted on a substrate holder to cover a partial region on the surface of the substrate, and the thin film is deposited by sputtering in a region on the surface of the substrate not covered with the mask member; the substrate carrying-in and carrying-out section has a substrate holder holding and releasing means performing mechanical holding and releasing of the substrate holder mounting the substrate, and a mask member holding and releasing means performing mechanical holding and releasing of the mask member;
   the substrate carrying-in and carrying-out section places the mask member on the surface of the substrate mounted on the substrate holder to cover the partial region on the surface of the substrate and carries the mask member together with the substrate mounted on the substrate holder into the sputtering system;
   the substrate carrying-in and carrying-out section takes out the mask member together with the substrate mounted on the substrate holder to the outside of the sputtering system, the mask member holding and releasing means releases the mask member, and the substrate carrying-in and carrying-out section carries out only the substrate and the substrate holder;
   the substrate is disc-shaped with an opening portion defined centrally thereof;
   the substrate holder has a cylindrical positioning section for positioning the substrate by being inserted through the opening portion of the substrate;
   the mask member comprises an annular inner mask covering a periphery of the opening portion of the substrate and having an opening portion through which the positioning section of the substrate holder is inserted, and an annular outer mask covering an outer peripheral portion of the substrate and engaging an outer periphery of the substrate holder;
   the substrate carrying-in and carrying-out section has:
   the substrate holder holding and releasing means,
   the mask member holding and releasing means which includes inner mask holding and releasing means performing mechanical holding and releasing of the inner mask, and outer mask holding and releasing means performing mechanical holding and releasing of the outer mask, and
   holding and releasing control means performing a control of switching between holding and releasing of the substrate holder by the substrate holder holding and releasing means and a control of holding or releasing of the inner mask by the inner mask holding and releasing means;
   the thin film depositing section has holding and releasing control means performing a control of holding or releasing of the outer mask by the outer mask holding and releasing means;
   the substrate holder holding and releasing means is a chuck for holding or releasing the substrate holder by an inner peripheral surface of the positioning section of the substrate holder;
   the inner mask holding and releasing control means is a chuck for holding or releasing the inner mask by an outer peripheral surface of the inner mask;
   the outer mask holding and releasing control means is a chuck for holding or releasing the outer mask by an outer peripheral surface of the outer mask;
   the positioning section of the substrate holder has a groove in an inner peripheral surface thereof;
   each of the inner mask and the outer mask has a groove in an outer peripheral surface thereof;
   the chuck for holding or releasing the substrate holder has a claw for engagement with the groove in the inner peripheral surface of the positioning section of the substrate holder;
   the chuck for holding or releasing the inner mask has a claw for engagement with the groove in the outer peripheral surface of the inner mask; and
   the chuck for holding or releasing the outer mask has a claw for engagement with the groove in the outer peripheral surface of the outer mask.

* * * * *